United States Patent [19]

Sasama

[11] Patent Number: 5,479,366
[45] Date of Patent: Dec. 26, 1995

[54] ASSOCIATIVE MEMORY

[75] Inventor: Hiroshi Sasama, Tokyo, Japan

[73] Assignee: Kawasaki Steel Corporation, Hyogo, Japan

[21] Appl. No.: 316,337

[22] Filed: Sep. 30, 1994

[30] Foreign Application Priority Data

Oct. 4, 1993 [JP] Japan ..................................... 5-248119

[51] Int. Cl.$^6$ .................................................. G11C 15/00
[52] U.S. Cl. ................. 365/49; 365/189.07; 365/189.12; 365/218
[58] Field of Search .............................. 365/49, 189.07, 365/189.12, 239, 240, 218

[56] References Cited

U.S. PATENT DOCUMENTS 4,296,475  10/1981  Nederlof et al. .
4,879,687  11/1989  Okamoto et al. .......................... 365/49

FOREIGN PATENT DOCUMENTS 0230296   7/1987  European Pat. Off. .
0341899  11/1989  European Pat. Off. .
57-74887   5/1982  Japan .

OTHER PUBLICATIONS

"The Associative Memory Structure," *Proceedings of the Fall Joint Computer Conference*, vol. 27, Part 1 (1965), pp. 371–388.

*Primary Examiner*—David C. Nelms
*Assistant Examiner*—Huan Hoang
*Attorney, Agent, or Firm*—Oliff & Berridge

[57] ABSTRACT

An associative memory wherein unnecessary data may be exclusively erased on a batch basis. Each word memory in the associative memory has a corresponding first flag which indicates whether or not effective data is stored in the memory and a second flag which indicates of whether or not a match has been detected. The first flags are reset on a batch basis in accordance with the state of the associated second flags.

3 Claims, 7 Drawing Sheets

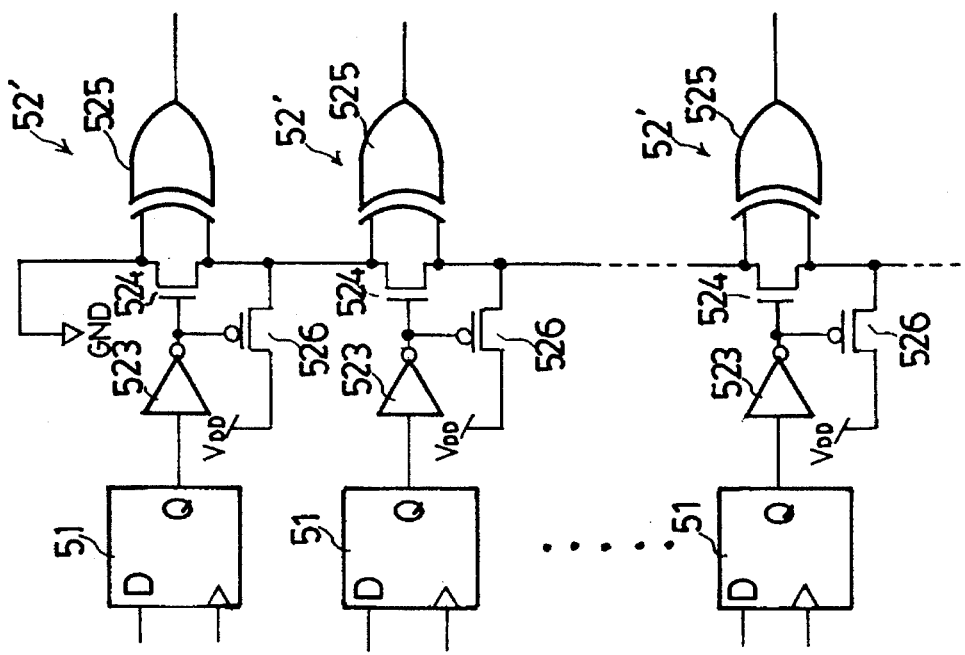
F I G. 3 (A)
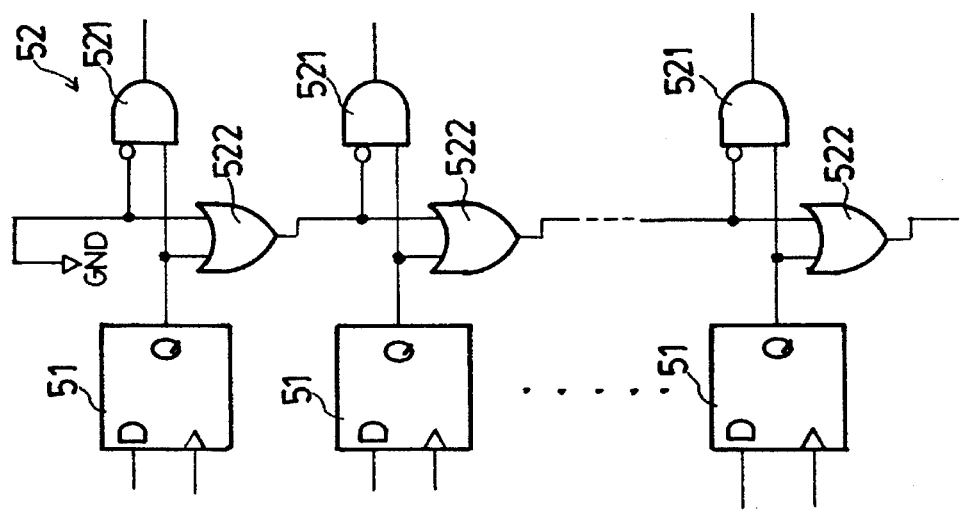
F I G. 3 (B)

ASSOCIATIVE MEMORY

BACKGROUND OF THE INVENTION

1. Field of the Invention

The present invention relates to a content addressable memory or an associative memory comprising a number of word memories each for storing data, and having such a function that a match or mismatch, between data stored in word memories and is indicated data inputted to the word memories retrieved.

1. Description of the Related Art

Recently, there has been proposed an associative memory provided with the retrieval function as mentioned above.

FIG. 4 is a circuit block diagram of the conventional associative memory by way of example.

Referring to FIG. 4, an associative memory 10 is provided with a number of word memories 11a, 11b, ..., 11n each consisting of a 5-bit of serial memory cell by way of example. Further, the associative memory 10 comprises a retrieval register 12 which is arranged to receive and latch a word of retrieval data. A bit pattern of the retrieval data latched in the retrieval register 12 in its entirety or in a part specified is compared with respect to data stored in each of the word memories 11a, 11b, ..., 11n. As a result of the comparison, if there are found any of the word memories 11a, 11b, ..., 11n of which the bit pattern matches with that of the retrieval data, a match signal given by a logic "1" will appear on the corresponding match lines 14a, 14b, 14n which are provided in conjunction with the word memories 11a, 11b, ..., 11n, respectively. On the other hand, a mismatch signal given by a logic "0" will appear on the remaining match lines 14a, 14b, ..., 14n.

Assuming that the signals "0", "1", "0", "0", "1"..., "0" appear on the flag lines 14a, 14b, ..., 14n, respectively, these signals are applied to a priority encoder 15. The priority encoder 15 is so arranged to output an address signal AD corresponding to the match line given with a highest priority among the match lines (here, two match lines 14b and 14e) on which the match signal given by a logic "1" appears. Supposing that the priority is higher as alphabet of a suffix of the reference character becomes younger, in this case, the match line 14b is selected as the highest priority match line. Thus, the priority encoder 15 outputs an address signal AD corresponding to the highest priority match line 14b, which address signal AD is applied to an address decoder 16, as occasion demands. The address decoder 16 decodes the received address signal AD and outputs an access signal (here a signal given by a logic "1") to the associated one (here a word line 17b) of word lines 17a, 17b, ... 17n which are provided in conjunction with the word memories 11a, 11b, ..., 11n, respectively. Thus, data stored in the word memory 11b associated with the word line 17b on which the access signal appears is read out to an output data register 18.

As described above, according to the associative memory 10, the contents or data stored in a number of word memories 11a, 11b, ..., 11n are retrieved using the retrieval data, so that an address of the word memory involved in the data match is generated, and thus it is possible to read out the whole data stored in the word memory.

FIG. 5 is a detailed circuit diagram of one of the word memories in the associative memory.

A word memory 11 comprises five memory cells 11-1, 11-2, ..., and 11-n each having the same structure. The memory cells 11-1, 11-2, ..., and 11-n are provided with first inverters 20-1, 20-2, ..., and 20-n and second inverters 21-1, 21-2, ..., and 21-n, in pairs such that their outputs are connected to their inputs, respectively. Providing pairs of inverters 20-1 and 21-1; 20-2 and 21-2; ...; and 20-n and 21-n permits the memory cells 11-1, 11-2,.-., and 11-n to each store one bit of information expressed by logic "1" or logic "0", respectively.

In the memory cells 11-1, 11-2, ..., and 11-n, the outputs of the first inverters 20-1, 20-2,..., and 20-n are connected through N channel transistors 22-1, 22-2, ..., and 22-n to bit lines 23-1, 23-2, ..., and 23-n, respectively. Gate electrodes of the transistors 22-1, 22-2,..., and 22-n are connected to a word line 24. The outputs of the second inverters 21-1, 21-2, ..., and 21-n are connected through N channel transistors 25-1, 25-2, ..., and 25-n to bit bar lines 26-1, 26-2, ..., and 26-n, respectively. Gate electrodes of the transistors 25-1, 25-2, ..., and 25-n are also connected to the word line 24. Further, in the memory cells 11-1, 11-2, ..-, and 11-n, there are provided pairs of N channel transistors 27-1 and 28-1, 27-2 and 28-2, ... 27-n and 28-n, respectively, which are connected in series between the bit lines 23-1, 23-2, ..., and 23-n and the bit bar lines 26-1, 26-2, ..., and 26-n, respectively. Gate electrodes of transistors 27-1, 27-2 ..., and 27-n, as ones of these pairs of transistors 27-1 and 28-1, 27-2 and 28-2, ... 27-n and 28-n, are connected to the outputs of the first inverters 20-1, 20-2, ... and 20-n, respectively. Gate electrodes of other transistors 28-1, 28-2, ..., and 28-n are connected to the outputs of the second inverters 21-1, 21-2, ... and 21-n, respectively.

On the match line 14, there are provided transistors 36-1, 36-2, ..., and 36-n, which are associated with the word memories 11-1, 11-2, ..., and 11-n, respectively, and are connected in series with each other. Gate electrodes of the transistors 36-1, 36-2, ..., and 36-n are connected to points between pairs of transistors 27-1 and 28-1, 27-2 and 28-2, . . . and 27-n and 28-n, respectively.

Further, there is provided an additional transistor 36-0 connected in series with the match line 14 which is grounded through the transistor 36-0. A gate electrode of the transistor 36-0 is connected to the control line 30.

Furthermore, there is provided a sensing inverter 31 which is connected with the other end (right hand in FIG. 5) of the match line 14. The match line 14 extends also to the output side of the inverter 31 and is connected therethrough to the priority encoder 15 (refer to FIG. 4).

Between an input of the inverter 31 and the power supply $V_{DD}$, there are provided two P-type of transistors 32 and 33. A gate electrode of the P-type of transistor 32 is connected to the control line 30. A gate electrode of the P-type of transistor 33 is connected to an output of the inverter 31.

In the associative memory having the word memories as mentioned above in its structure and its peripheral circuits, a match retrieval is conducted in a manner as set forth below.

Assuming that the memory cell 11-1 stores information of a logic "1", the output side of the first inverter 20-1 takes a state of a logic "1", and the output side of the second inverter 21-1 takes a state of a logic "0".

It is assumed that a retrieval for a logic "1" is performed for the above-mentioned memory cell 11-1. That is, the bit line 23-1 is enabled with a logic "1", and the bit bar line 26-1 is enabled with a logic "0". While the word line 24 is kept in a state of a logic "0". Since a logic level "1" of voltage is applied to the gate electrode of the transistor 27-1, and a logic level "1" of signal on the bit line 23-1 is applied to the gate electrode of the transistor 36-1, the transistor 36-1 turns on. That is, when the bit information stored in the memory cell 11-1 and the bit information in the retrieval data entered through the bit line 23-1 and the bit bar line 26-1 are equivalent to each other, the associated transistor 36-1 turns on.

Assuming that the memory cell 11-2 stores information of a logic "0", the output side of the first inverter 20-2 takes a state of a logic "0", and the output side of the second inverter 21-2 takes a state of a logic "1".

It is assumed that a retrieval for a logic "1" is also performed for the above-mentioned memory cell 11-2. That is, the bit line 23-2 is enabled with a logic "1", and the bit bar line 26-2 is enabled with a logic "0". In this case, a logic level "0" of signal on the bit bar line 26-2 is applied through the transistor 28-2 to the gate electrode of the transistor 36-2, so that the transistor 36-2 is kept turned off. Thus, in case of the mismatch, the electric charge, which has been precharged on the match line 14, is not discharged.

With respect to the masked bit, as shown concerning the memory cell 11-n, both the bit line 23-n and the bit bar line 26-n are enabled with the logic "1". In this case, either the transistor 27-n or the transistor 28-n turns on in accordance with the fact that the memory cell 11-5 has stored logic "0" information or logic "1" of information, so that the transistor 36-n turns on.

To conduct a retrieval, first, the control line 30 is enabled with "0", so that a transistor 32 turns on whereby a match line 14 at the input side of the inverter 31 is precharged. Thereafter, the control line 30 is enabled with "1", so that the transistor 32 turns off to stop the precharge and the transistor 36-0 turns on.

In this case, when data stored in the memory cells 11-1, 11-2, ..., and 11-n, which memory cells constitute the word memory 11, matches with the entered retrieval information (as mentioned above, the masked bit is regarded as a "match"), all of the transistors 36-1, 36-2, ..., and 36-n turn on, so that the electric charge, which has been precharged on the match line 14, is discharged. Thus, the inverter 31 outputs a logic "1" signal.

Incidentally, it is noted that FIG. 5 merely shows by way of example the memory structure of the associative memory, and there are proposed various types of structure (See, for example, Japanese Patent Application No. 216424/1993).

As mentioned above, according to the associative memory, it is possible to immediately know through performing a retrieval operation once only whether or not data stored in the memory match with the entered retrieval data. Thus, the associative memory is widely applicable in the fields in which a high speed data processing is required.

Regarding the associative memory, there have been proposed various fields of technology. Here, there will be described the technology later referred to in the explanation of the present invention later.

One of the various fields of technology is disclosed in Japanese Patent Application Laid Open Gazette No. 74887/1982. In a case where data which match with certain retrieval data are stored in a plurality of word memories, a priority encoder 15 (see FIG. 4) always outputs an address of a specified word memory associated with the highest priority match line. This involves inequality between the plurality of word memories in which matched data has been stored. Such a problem has been solved in accordance with the above referenced technology in which a flag indicative of whether or not read out of the address is performed is stored in the associated word memory, and regarding the word memories which have been subjected to read out of the address, even if the match is-detected again through after retrieval, the priority is lowered.

Another technology is disclosed in Japanese Patent Publication No. 31558/1986. A number of word memories, which constitutes an associative memory, do not always data retrieve in their entirety. It happens that a part of those word memories are each in an empty state in which effective data are not stored therein, or new effective data is written into the empty word memory. In this case, since it is troublesome to manage at the outside what word memory is in an empty state, a flag indicative of whether effective data are stored in the associated word memory, or the word memory concerned is in an empty state is stored in the associated word memory. When the effective data is written, the associative memory itself finds out the empty word memory to write the effective data therein.

The relevancy between these two kinds of technologies and the present invention will be discussed later. Now, there will be described an example of application of the associative memory to a LAN (Local Area Network) hereinafter.

FIGS. 6(A)–6(C) are each a view showing an example of the LAN.

As shown in FIG. 6(A), it is assumed that coupled to two communication lines LAN 1 and LAN 2 are a plurality of terminals A–G, and T–Z, respectively to constitute two communication networks. Further, it is assumed that traffic volume of each of the communication lines LAN 1 and LAN 2, that is, quantity of data transmitted via the communication line, or a degree of congestion of the communication line, is given with "10".

When there occurs a necessity for connecting these two communication lines to each other, if they are simply connected to each other, as shown in FIG. 6(B), then the traffic volume of the communication lines LAN 1 and LAN 2 becomes 20. This involves such a result that the communication lines are dramatically congested, so that the connection among the terminals becomes more difficult, thereby increasing waiting time and idle time.

Hence, usually, as shown in FIG. 6 (C), connected between the communication lines LAN 1 and LAN 2 is a bridge for performing filtering as to whether or not data originated from one of the communication lines LAN 1 and LAN 2 is transmitted to the other. When the bridge is connected, assuming that traffic volume of data passing through the bridge, that is, traffic volume as to transfer of data bridging two communication lines LAN 1 and LAN 2, is "1", adding traffic volume "10" of the interior of each of the communication lines LAN 1 and LAN 2, traffic volume of each of the communication lines LAN 1 and LAN 2 becomes "11". Thus, traffic volume is extremely decreased in comparison with the case, as shown in FIG. 6 (B), in which two communication lines LAN 1 and LAN 2 are simply connected to each other. Here, while there has been described the connection between two communication lines LAN 1 and LAN 2, connection of a number of communication lines to the bridge may enhance the difference in the traffic.

FIG. 7 is an illustration useful for understanding the function of the bridge.

The bridge includes a memory. First, starting with a null state, for example, when data is transmitted from the terminal A of the communication line LAN 1, upon receipt of the data from the communication line LAN 1 end, the bridge learns that the terminal A is connected to the communication line LAN 1. This learning is conceptually implemented in such a manner that the memory inside of the bridge is provided with table 1 and table 2, which are associated with the communication lines LAN 1 and LAN 2, respectively, and the terminal A is written into the table 1 associated with the communication line LAN 1. At the time point of the learning of the terminal A, it is not determined whether or not the receiving destination of the data transmitted from the terminal A resides in the communication network involved in the LAN 1 end, and thus at this time point the data is allowed to pass through unconditionally the bridge.

Repeat of the above-mentioned learning makes it possible to build table 1 and table 2, as shown in FIG. 7, in the bridge. After these tables have been built, for example, as shown in the figure, data which is involved in terminal B (the LAN 1 end) as a transmitting source and terminal X (LAN 2 end) as a receiving destination, is allowed to pass through the bridge, upon recognition by the bridge of the fact that the terminals B and X are located at opposite sides over the bridge from each other. On the other hand, in a case where the transmitting source and the receiving destination are denoted by terminals A and E both belonging to the LAN 1 end, data is inhibited from passing through the bridge, upon recognition by the bridge of the fact that the terminals A and E reside in the same communication network is located on one side of the bridge. This scheme contributes to reduction of traffic volume.

Adopting an associative memory as the memory used in the bridge as mentioned above may contribute to a high speed processing. For example, the associative memory is used to store information concerning the respective terminals A–G and T–Z, and further information as to whether each of those terminals belongs to table 1 (being connected to the LAN 1 end) or table 2 (being connected to the LAN 2 end). To determine whether or not data are allowed to pass through the bridge, for example, in a case where the receiving destination is given with terminal X, the retrieval is performed using "X" as retrieval data, and it is recognized that "X" is a terminal belonging to table 2 (LAN 2). In this manner, it may be determined whether or not data is allowed to pass through the bridge.

On the contrary, where the bridge is equipped with the conventional RAM or the like, there are needs to read out stored data one by one and retrieve the data through sequential comparison to identify as to whether or not the read data is involved in the terminal X. Thus, in this case, a lot of time will be required for determination as to allowance or inhibition of passage of data through the bridge.

As described above, the associative memory may be preferably used in, for example, a LAN network and the like. Further, improvement as set forth below is desired.

Specifically, in the bridge, as mentioned above, the learning starts with a null state, and in this learning process it is not determined what communication network a transmitting source belongs to, and thus there occurs a necessity for unconditional passage of data through the bridge. This involves, as shown in FIG. 6(B), an increase of traffic volume. Such an increase of traffic volume is not a problem, if it occurs first once only. Actually, however, the bridge is obliged to frequently allow unconditional passage of data, usually, for example, every several tens of seconds to a minute. The reason why the unconditional passage of data must be frequently allowed is that there are needs to repeatedly initialize the memory within the bridge for learning to remove terminals which are not concerned with transmitting and receiving data. As described above, there are needs to repeatedly initialize the memory. This hinders a further decrease of traffic volume.

In order to solve the foregoing, the initialization is not carried out throughout the memory, and there is prepared a recording as to whether or not the respective terminals each attend transmitting and receiving of data during a period of time from the last initialization to the point of current interest. In initialization only the data of the terminals which do not attend are subjected to the initialization referring to the record, while the data of the terminals which attend are maintained without the initialization. However, in case of the use of the conventional associative memory, if it is intended to implement the above-mentioned idea, it is necessary to sequentially erase one by one the terminal data which need to be initialized, referring to flags each indicative of attendance or nonattendance at transmitting and receiving of data. This takes, similar to the sequential comparison as described above, a lot of time in initialization.

SUMMARY OF THE INVENTION

In view of the foregoing, it is therefore an object of the present invention to provide an associative memory capable of erasing only unnecessary data on a batch basis.

The associative memory according to the present invention, which attains the above-mentioned object, basically comprises a plurality of word memories each for storing data, and a plurality of match detection circuits each corresponding to an associated one of said plurality of word memories, for detecting a match or mismatch between data stored in the associated word memory and an entered retrieval data, characterized by:

(1) a plurality of first flag registers each corresponding to the associated one of said plurality of word memories, for storing a first flag indicative of whether the associated word memory is in a first storage state such that effective data as an object of retrieval is stored therein or in a second storage state such that the effective data is not stored therein and thus overwriting is permitted;

(2) a plurality of second flag registers each corresponding to the associated one of said plurality of word memories, for storing a second flag indicative of whether the associated word memory is in a first historical state such that a match between the associated word memory and entered retrieval data was detected at least once in past retrievals or in a second historical state such that a match between the associated word memory and entered retrieval data was not detected in past retrievals; and (3) a storage state alteration circuit for altering on a batch basis into the second storage state the word memories associated with the second flag registers each storing the second flag indicative of either the first historical state or the second historical state, among the word memories residing in the first storage state.

It is preferable that the above-mentioned associative memory further comprises a storage state reset circuit for altering on a batch basis the word memories residing in the first storage state into the second storage state. And in addition, it is also preferable that the above-mentioned associative memory further comprise a historical state reset circuit for causing said plurality of second flag registers to store on a batch basis the second flags indicative of the second historical state.

In the associative memory according to the present invention, there are provided a first flag indicative of whether or not effective data is stored and a second flag indicative of whether or not a match has been detected, corresponding to the associated one of the word memories. The contents word memories storing effective data are erased on a batch basis in accordance with the state of the associated second flags. Consequently, for example, in initialization of the bridge as mentioned above, it is possible to erase on a batch basis only data of terminals which have not been matched to retrieval data in the past, that is, to erase references to terminals which have not attended transmitting and receiving of data. Incidentally, regarding erasing of the word memories, while it is acceptable to erase data itself stored in the word memories concerned, it is not required. For example, it is acceptable that the flag content of the first flag register is rewritten so that the word memory concerned does not attend the retrieval.

As described above, the Japanese Patent Application Laid Open Gazette No. 74887/1982 discloses the flag similar to the second flag referred to in the present invention. Further, Japanese Patent Publication No. 31558/1986 discloses the first flag referred to in the present invention. However, as mentioned above, these documents disclose technical means for solving the problems which are quite different from each other, and there is nothing to technically combine the first flag and the second flag with each other. Also, none of these documents disclose the use of the storage state alteration circuit referred to in the present invention.

BRIEF DESCRIPTION OF THE DRAWINGS

FIGS. 3(A) and 3(B) are each a circuit diagram of a plural-selection separating circuit by way of example;

DESCRIPTION OF THE PREFERRED EMBODIMENTS

Hereinafter, there will be described embodiments of the present invention.

Figure 1:
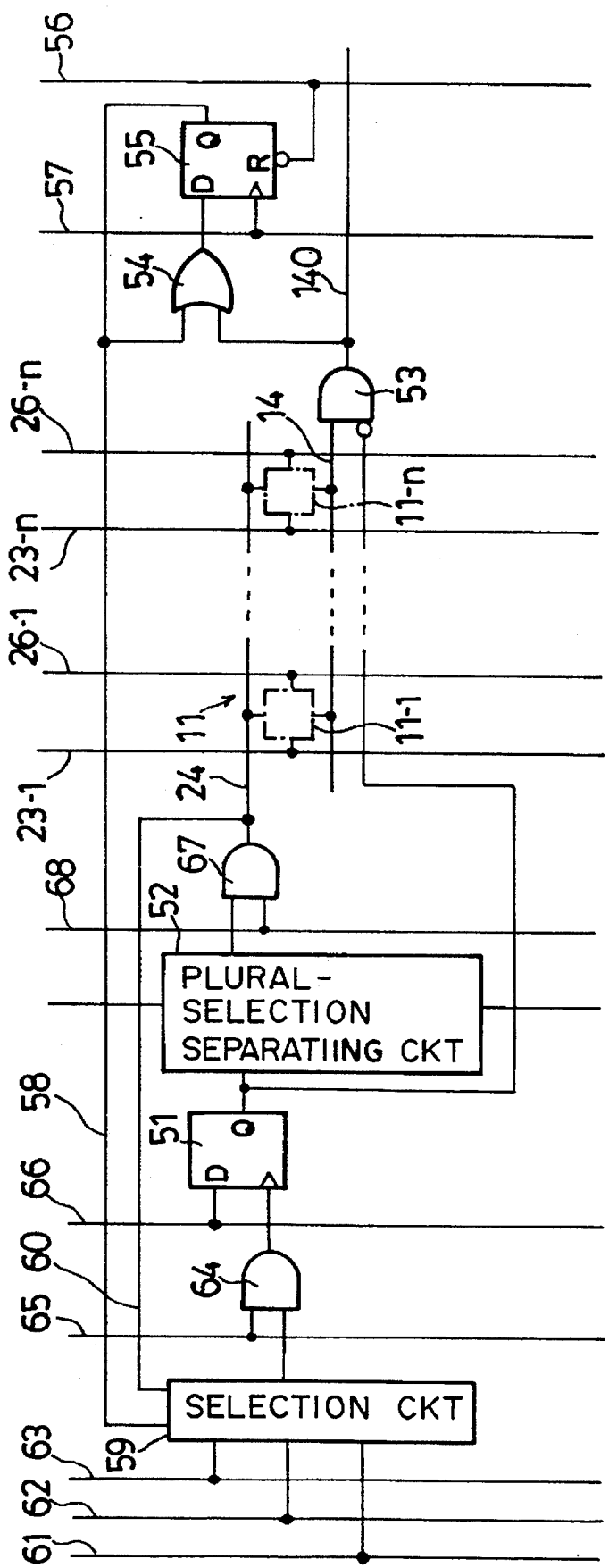
FIG. 1 is a circuit diagram of an aspect portion associated with one of the word memories in the associative memory according to an embodiment of the present invention.
Figure 5:
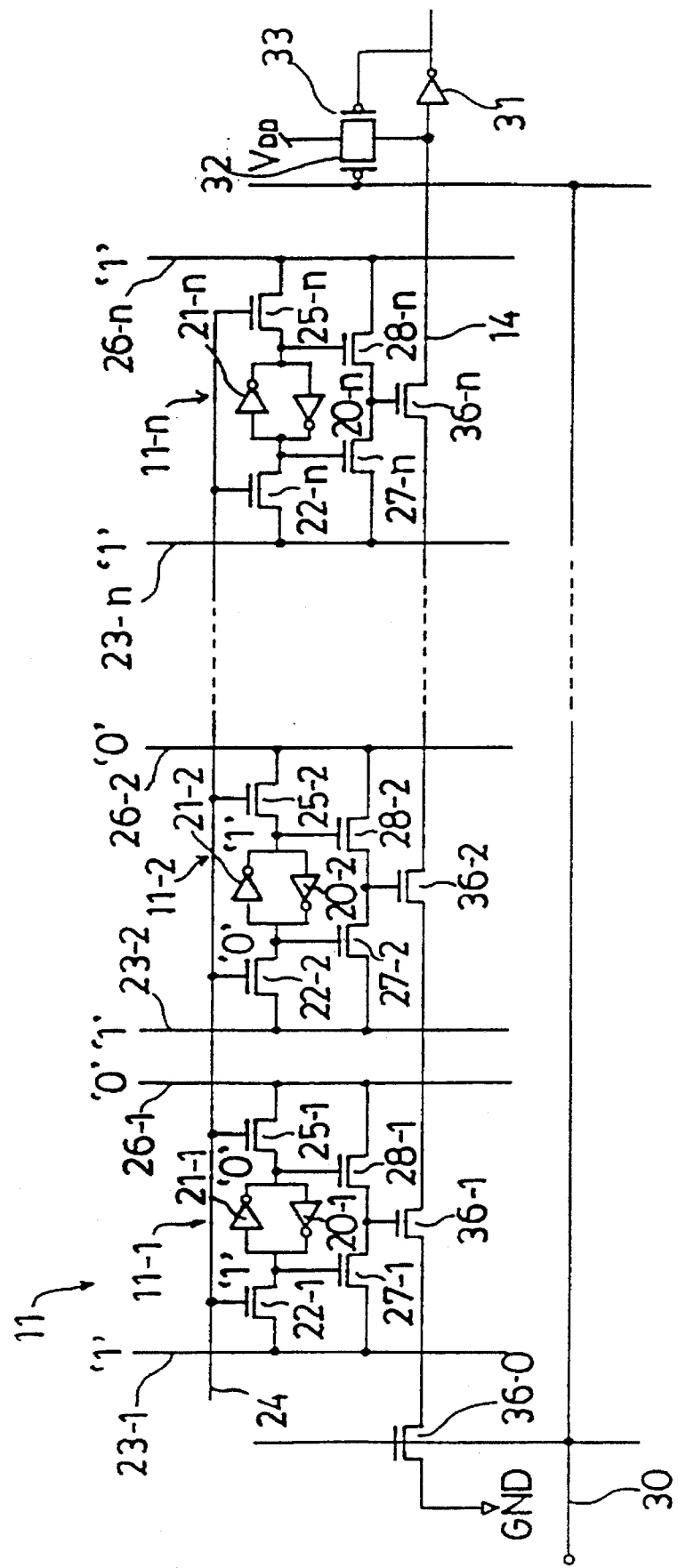
FIG. 5 is a detailed circuit diagram of one of the word memories in the associative memory.
Figure 6:
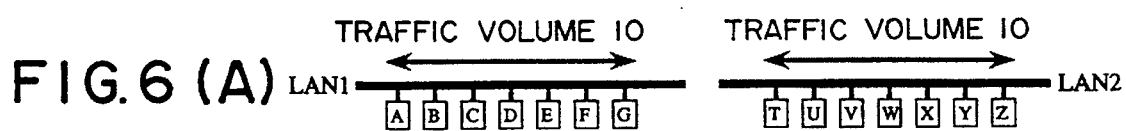
FIGS. 6(A)–6(C) are illustrations of LAN's by way of example.
Figure 6:
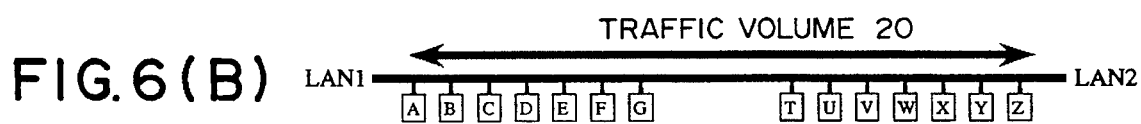
Figure 6:
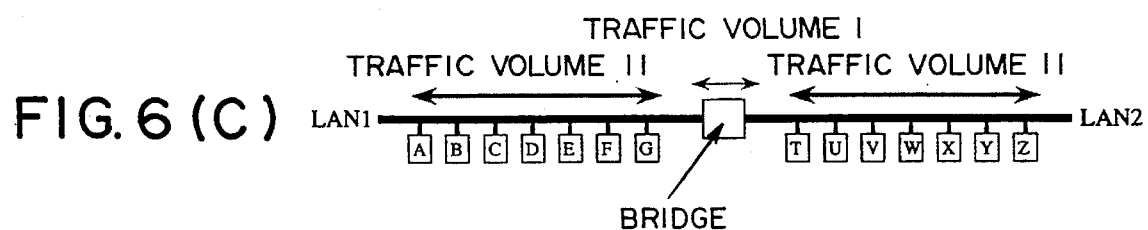
Figure 7:
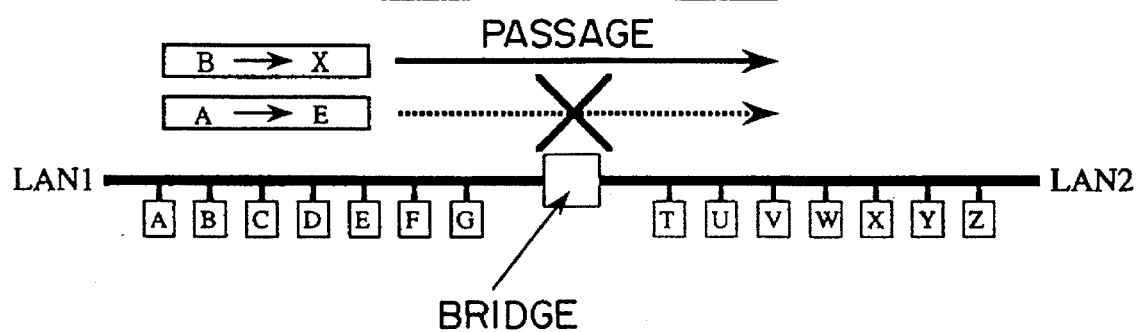
FIG. 7 is a view useful for understanding a function of a bridge.

FIG. 1 is a circuit diagram of an aspect portion associated with one of the word memories in the associative memory according to an embodiment of the present invention. In FIG. 1, the same parts are denoted by the same reference numbers as those of FIG. 5 involved in the prior art.

In FIG. 1, arrangements of word memories 11 and match lines 14 are abbreviated. There is provided the first flag register 51 corresponding to the associated word memory 11. The first flag register 51 stores a logical value "0" when the associated word memory 11 stores effective data which is the retrieval object, and stores a logical value "1" (an example of the first flag referred to the present invention) when the associated word memory 11 stores ineffective data which is out of the retrieval object and thus allows overwrite (this is referred to as that the associated word memory 11 is "in an empty state"). Here, it is assumed that the empty flag is "0", that is, the word memory 11 shown in the figure stores effective data. A Q-output of the first flag register 51 is connected to a plural-selection separation circuit 52 and an inverted input end of an AND gate 53. The plural-selection separation circuit 52 will be described later.

Figure 4:
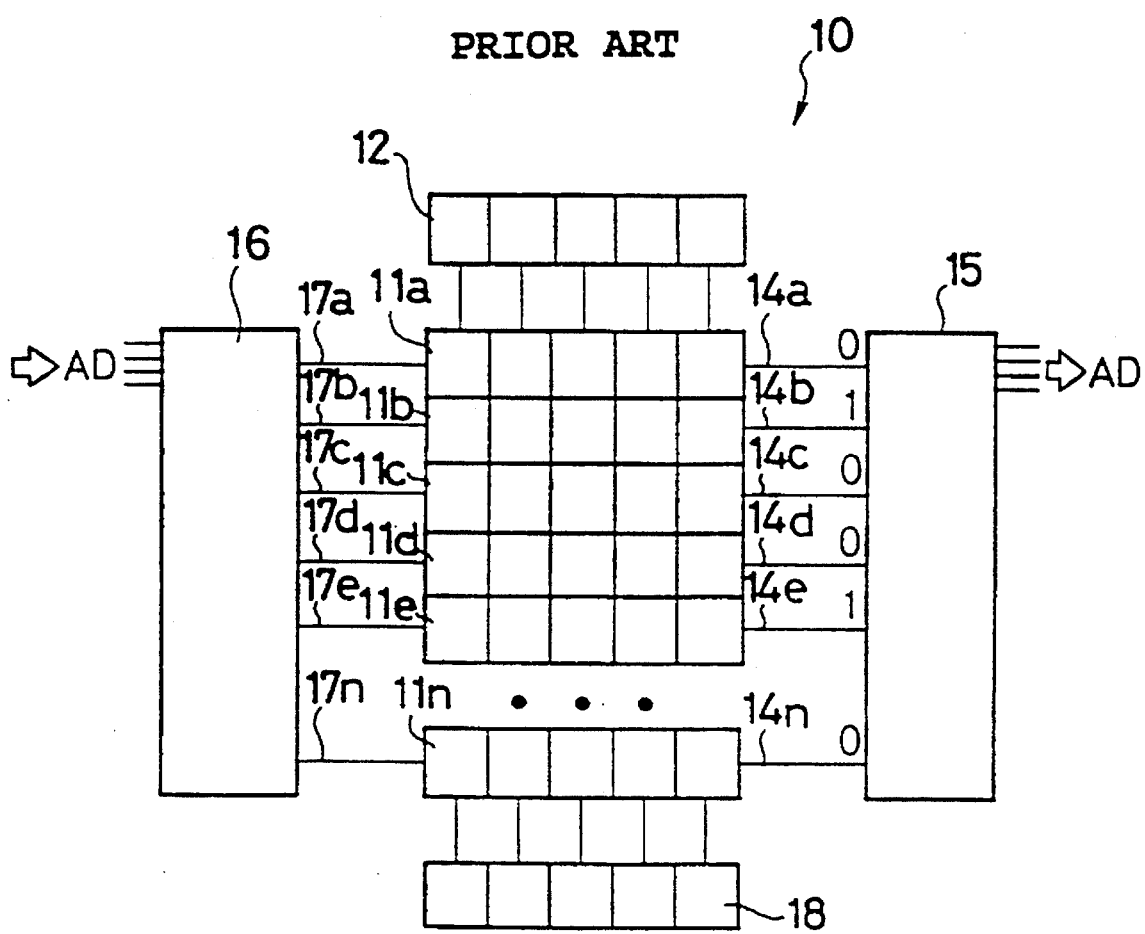
FIG. 4 is a circuit diagram of an associative memory according to the prior art by way of example.

Assuming that when a retrieval is conducted through supplying retrieval data to bit line 23-1, . . . , and 23-n, and bit bar line 26-1, . . . , and 26-n, respectively, the retrieval data and the data stored in the word memory shown in the figure match, a match line 14 is given with a logical value "1". Connected to a non-inverted input of the AND gate 53 is the match line 14, and an output of the first flag register is of a logical value "0". Hence, an output of the AND gate 53 becomes a logical value "1". Here, a signal line extending from the output of the AND gate 53 is also referred to as a match line 140. The match line 140 extends, instead of the match line 14 referred to in the prior art, to the priority encoder 15 (FIG. 4). Further, the output of the AND gate 53 is also supplied through an OR gate 54 to the second flag register 55. The second flag register 55 is provided for each word memory, and is responsive to a reset pulse entered via a historical flag reset signal line 56 to initially store a logical value "0" indicative of the absence of a match in the past regarding the associated word memory 11. In this manner, when a match occurs on the word memory concerned, the output of the AND gate 53 becomes a logical value "1" indicative of a match. As a result, a clock pulse is applied to a historical flag clock line 57 in such a timing that the match signal is applied through the OR gate 54 to the second flag register 55. Thus, the second flag register 55 stores a logical value "1" indicative of a match. Once the second flag register 55 stores a logical value "1", an overwrite of the logical value "1" is always continued, whenever the clock pulse is applied to the historical flag clock line 57, until it is reset next, since the Q-output of the second flag register 55 is supplied again to the second flag register 55 through the OR gate 54. The Q-output of the second flag register 55 is inputted through the OR gate 54 to itself and a selection circuit 59 as well via a signal line 58. Connected to the selection circuit 59 are a signal line 60 connected to the word line 24, and three selection signal lines 61, 62 and 63 as well.

Figure 2:
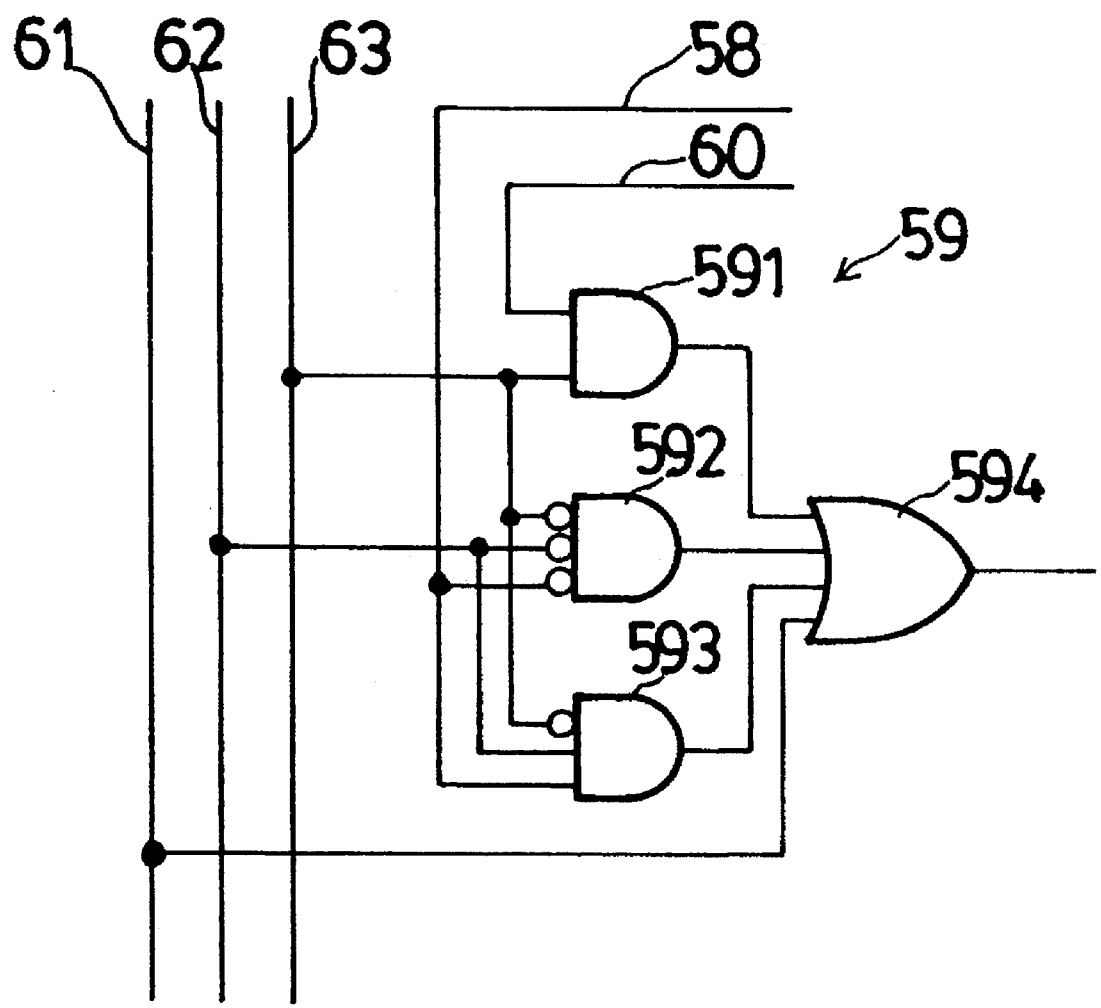
FIG. 2 is a circuit diagram of a selection circuit.

FIG. 2 is a circuit diagram of a selection circuit 59.

The selection circuit 59 comprises a two-input AND gate 591, a three-input AND gate 592 in which all the signals at the input end are inverted, a three-input AND gate 593 in which only one of the signals at the input end is inverted, and a four-input OR gate 594 of which inputs are connected to the respective outputs of the AND gates 591, 592 and 593, and a selection signal line 61.

The selection signal line 61 serves, when enabled, to cause the whole first flag registers 51 each corresponding to the associated word memory 11 to store on a batch basis the empty flag "1" indicative of the empty state of the word memory concerned. Applying a logical value "1" of signal to the selection signal line 61 permits the signal to be inputted through the OR gate 594 to the AND gate 64 shown in FIG. 1. Since the AND gate 64 is also connected to an empty flag clock signal line 65, and a logical value "1" of signal is supplied from the selection circuit 59 to the AND gate 64, applying a clock pulse to the empty flag clock signal line 5 permits the clock pulse to be passed via the AND gate 64 to the clock input terminal of the first flag register 51. At that time, if an empty flag data line 66 is enabled with a logical value "1" of signal, the empty flag "1" is set up to the first flag register 51. This causes the whole word memories 11 to the empty state on a batch basis. As mentioned above, the Q-output of the first flag register 51 is connected to the inverted input end of the AND gate 53. Hence, even if the match is detected on the word memory 11 in the empty state so that the match line 14 becomes a logical value "1", it is shutted out by the AND gate 53. Thus, the match line 140 is kept "0".

In a state that all three selection signal lines 61, 62 and 63 are given with "0", if the second flag register 55 stores "0" indicative of the absence of a match in the past, the signal line 58 is placed to the state of "0" and the output of the AND gate 592 becomes "1", and then the signal "1" is outputted via the OR gate 594. In this condition, if the clock pulse is applied to the the empty flag clock line 65, the empty flag is stored in the first flag register 51. In this manner, the word memories 11 associated with the second flag register 55, which register stores "0" indicative of the absence of a match in the past, are changed to the empty state on a batch basis.

In a state that the selection signal lines 61 and 63 are kept "0" and the selection signal line 62 is kept "1", if the second flag register 55 stores "1" indicative of the presence of a match in the past, the signal line 58 is placed to the state of "1" and the output of the AND gate 593 becomes "1", and then the signal "1" is outputted via the OR gate 594. In this case, the word memories 11 associated with the second flag register 55, which register stores "1" indicative of the presence of a match in the past, are changed to the empty state on a batch basis.

Next, there will be described writing of data into the word memories 11. It is assumed that among a number of word memories 11, at least one of memories including the word memory 11 shown in the figure is in the empty state. In other words, it is assumed that the first flag register 51 associated with the word memory 11 concerned stores the empty flag "1". In this condition, the plural-selection separating circuit 52 selects the highest priority of one among the word memories 11 in the empty state in accordance with a predetermined priority sequence.

FIGS. 3(A) and 3(B) are each a circuit diagram of a plural-selection separating circuit 52 by way of example.

The plural-selection separating circuits 52 shown in FIG. 3(A) each comprise an AND gate 521 each having two inputs one of which is inverted in input, and an OR gate 522, which are connected as shown in the figure. One of the inputs of the OR gate 522, illustrated in the top of the figure, constituting the plural-selection separating circuit 52, is earthed (ground GND).

In the plural-selection separating circuits 52, the priority is higher with upper one in the figure. In a case where the empty flag "1" is stored in a plurality of first flag registers 51, the signal "1" is outputted from the AND gate 521 of the plural-selection separating circuit 52 associated with the first flag register 51 having the highest priority among the plurality of first flag registers 51.

The plural-selection separating circuits 52' shown in FIG. 3(B) each comprise, as shown in the figure, an inverter 523, n-channel transistor 524, a p-channel transistor 526 and an exclusive OR gate 525. One end of the p-channel transistor 526, constituting each the plural-selection separating circuit 52', is connected to a power source $V_{DD}$. And one of the inputs of the exclusive OR gate 525, illustrated in the top of the figure, constituting the plural-selection separating circuit 52', is earthed (ground GND).

Also in the plural-selection separating circuits 52' shown in FIG. 3(B), similar to the plural-selection separating circuits 52 shown in FIG. 3(A), the priority is higher with upper one in the figure. In a case where the empty flag "1" is stored in a plurality of first flag registers 51, the signal "1" is outputted from the exclusive OR gate 525 of the plural-selection separating circuit 52' associated with the first flag register 51 having the highest priority among the plurality of first flag registers 51.

Connecting an encoder to the last stage of the plural-selection separating circuit shown in FIG. 3(A) or FIG. 3(B) may constitute the priority encoder 15 shown in FIG. 4. Thus, in a case where the first flag register 51 shown in FIG. 1 is the highest priority of one among the first flag registers 51 which store the empty flag "1", the signal "1" is outputted from the plural-selection separating circuit 52 shown in FIG. 1, and then supplied to the AND gate 67. The input of the AND gate 67 is also connected to a word line activating timing signal line 68.

Now, in the state that data to be stored in the word memory 11 is applied to bit line 23-1,..., and 23-n, and bit bar line 26-1, ..., and 26-n, respectively, a timing pulse is applied to the word line activating timing signal line 68. As a result, the word line 24 of the output side of the AND gate 67 becomes "1", so that the data on the bit line 23-1, ..., and 23-n, and the bit bar line 26-1, ..., and 26-n are stored in the word memory 11. The signal "1" on the word line 24 is applied via signal line 60 to the selection circuit 59. In this timing, if the selection signal line 63 is placed to a logical level "1", the output of the AND gate 591 of the selection circuit 59 shown in FIG. 2 issues a logical level "1" of signal. This logical level "1" of signal is outputted from the selection circuit 59 via the OR gate 594, and then applied to the AND gate 64. At that time, if a clock pulse is applied to the empty flag clock signal line 65, the clock pulse is passed via the AND gate 64 to the first flag register 51. In this timing, a logical level "0" of signal is applied to the empty flag data line 66. In this manner, the first flag register 51 stores the logical level "0" of signal indicative of the fact that the effective data has been stored in the associated word memory 11.

If the associative memory according to the present embodiment as described above is applied to the above-mentioned LAN network system, it is possible to store the empty flag "1" into the first flag registers 51 associated with the word memories 11 involved in no match detection in the past for erasing on a batch basis data of terminals which do not attend transmitting and receiving of data, and to reset all the flags of the second flag registers 55 to the state of the absence of a match detection, for initiating a historical state of the match detection, by means of determining whether or not a match detection is implemented in the past through the contents of the second flag registers 55 each corresponding to the associated word memory 11, or whether or not the respective terminals attend transmitting and receiving of data. In this manner, it is possible to erase on a batch basis unnecessary data, retaining the necessary data, thereby permitting a high speed erasing operation. And in addition, it is possible to contribute to decreasing traffic volume, different from the prior art in which data, including data of the terminals attending the transmitting and receiving of data, are erased on a batch basis. It should be noticed that the associative memory according to the present invention is not restricted in application to only the LAN system, but it is widely applicable also to such a case that it is needed to erase on a batch basis only ones involved in the presence of a match or only ones involved in the absence of a match in accordance with a history as to whether the match was present or absent.

The present invention is not limited to the particular embodiments described above. Various changes and modifications may be made within the spirit and scope of the invention.

I claim:

1. An associative memory including a plurality of word memories each for storing data, and a plurality of match detection circuits each corresponding to an associated one of said plurality of word memories, each one of the plurality of match detection circuits detecting a match or mismatch between data stored in the associated one of the plurality of word memories and entered retrieval data, the associative memory comprising:

a plurality of first flag registers, each of the plurality of first flag registers corresponding to an associated one of said plurality of word memories, each of the plurality of first flag registers storing a first flag indicative of whether the associated one of the plurality of word memories is a) in a first storage state such that effective data as an object of retrieval is stored in the associated one of the plurality of word memories, or is b) in a second storage state such that effective data is not stored in the associated one of the plurality of word memories and thus overwriting of the associated one of the plurality of word memories is permitted;

a plurality of second flag registers, each of the plurality of second flag registers corresponding to an associated one of said plurality of word memories, each of the plurality of second flag registers storing a second flag indicative of whether the associated one of the plurality of word memories is in a first historical state such that a match between data stored in the associated one of the plurality of word memories and entered retrieval data was detected at least once in past retrievals or in a second historical state such that a match between data stored in the associated one of the plurality of word memories and entered retrieval data was not detected in past retrievals; and a storage state alteration circuit for altering on a batch basis from the first storage state into the second storage state ones of the plurality of word memories associated with ones of the plurality of second flag registers which contain the second flag having a value indicative of the second historical state.

2. An associative memory according to claim 1, further comprising a storage state reset circuit for altering on a batch basis ones of the plurality of word memories residing in the first storage state into the second storage state.

3. An associative memory according to claim 1, further comprising a historical state reset circuit for causing said plurality of second flag registers to store on a batch basis the second flags indicative of the second historical state.

* * * * *